United States Patent
Rocklein et al.

(10) Patent No.: US 8,187,933 B2
(45) Date of Patent: *May 29, 2012

(54) METHODS OF FORMING DIELECTRIC MATERIAL-CONTAINING STRUCTURES

(75) Inventors: Noel Rocklein, Boise, ID (US); Chris Carlson, Nampa, ID (US); Dave Peterson, Meridian, ID (US); Cunyu Yang, Boise, ID (US); Praveen Vaidyanathan, Boise, ID (US); Vishwanath Bhat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

This patent is subject to a terminal disclaimer.

(21) Appl. No.: 12/895,535

(22) Filed: Sep. 30, 2010

(65) Prior Publication Data

US 2011/0020999 A1 Jan. 27, 2011

Related U.S. Application Data

(63) Continuation of application No. 12/251,733, filed on Oct. 15, 2008, now Pat. No. 7,820,506.

(51) Int. Cl.
*H01L 27/01* (2006.01)
(52) U.S. Cl. .. 438/240; 438/396; 438/763; 257/E21.008
(58) Field of Classification Search .................. 438/240, 438/396, 763, FOR. 430; 257/303, 532, 257/E21.008
See application file for complete search history.

(56) References Cited

U.S. PATENT DOCUMENTS

| | | | |
|---|---|---|---|
| 5,978,207 A | 11/1999 | Anderson et al. | |
| 6,190,924 B1 | 2/2001 | Lee | |
| 6,340,621 B1 | 1/2002 | Anderson et al. | |
| 6,780,708 B1 * | 8/2004 | Kinoshita et al. | 438/241 |
| 6,943,392 B2 | 9/2005 | Agarwal et al. | |
| 6,953,721 B2 | 10/2005 | Agarwal | |
| 7,002,788 B2 | 2/2006 | Jeong et al. | |
| 7,125,767 B2 | 10/2006 | Jeong et al. | |
| 7,307,303 B2 | 12/2007 | Yamamoto | |
| 7,375,002 B2 | 5/2008 | Roberts et al. | |
| 7,388,248 B2 | 6/2008 | Basceri et al. | |

(Continued)

FOREIGN PATENT DOCUMENTS

EP 1107304 6/2001

(Continued)

OTHER PUBLICATIONS

WO PCT/US2009/056506, Feb. 24, 2010, Search Report.

(Continued)

*Primary Examiner* — George Fourson, III
(74) *Attorney, Agent, or Firm* — Wells St. John P.S.

(57) ABSTRACT

Some embodiments include dielectric structures. The structures include first and second portions that are directly against one another. The first portion may contain a homogeneous mixture of a first phase and a second phase. The first phase may have a dielectric constant of greater than or equal to 25, and the second phase may have a dielectric constant of less than or equal to 20. The second portion may be entirely a single composition having a dielectric constant of greater than or equal to 25. Some embodiments include electrical components, such as capacitors and transistors, containing dielectric structures of the type described above. Some embodiments include methods of forming dielectric structures, and some embodiments include methods of forming electrical components.

12 Claims, 7 Drawing Sheets

U.S. PATENT DOCUMENTS

| | | |
|---|---|---|
| 2001/0024387 A1 | 9/2001 | Raaijmakers et al. |
| 2005/0271813 A1 | 12/2005 | Kher et al. |
| 2006/0097305 A1 | 5/2006 | Lee |
| 2007/0122967 A1 | 5/2007 | Lee |
| 2007/0249125 A1 | 10/2007 | Lee et al. |
| 2007/1022842 | 10/2007 | Matsui et al. |
| 2008/0044569 A1 | 2/2008 | Myo et al. |
| 2008/0116543 A1 | 5/2008 | Govindarajan |
| 2008/0203529 A1 | 8/2008 | Kang et al. |
| 2008/0224264 A1 | 9/2008 | Park |
| 2010/0002358 A1 | 1/2010 | Defay et al. |
| 2010/0014212 A1 | 1/2010 | Kil et al. |

FOREIGN PATENT DOCUMENTS

| | | |
|---|---|---|
| JP | 2006135339 | 5/2006 |
| JP | 2008-227217 | 9/2008 |

OTHER PUBLICATIONS

WO PCT/US2009/056506, Feb. 24, 2010, Written Opinion.
WO PCT/US2009/056506, Apr. 19, 2011, IPRP.

* cited by examiner

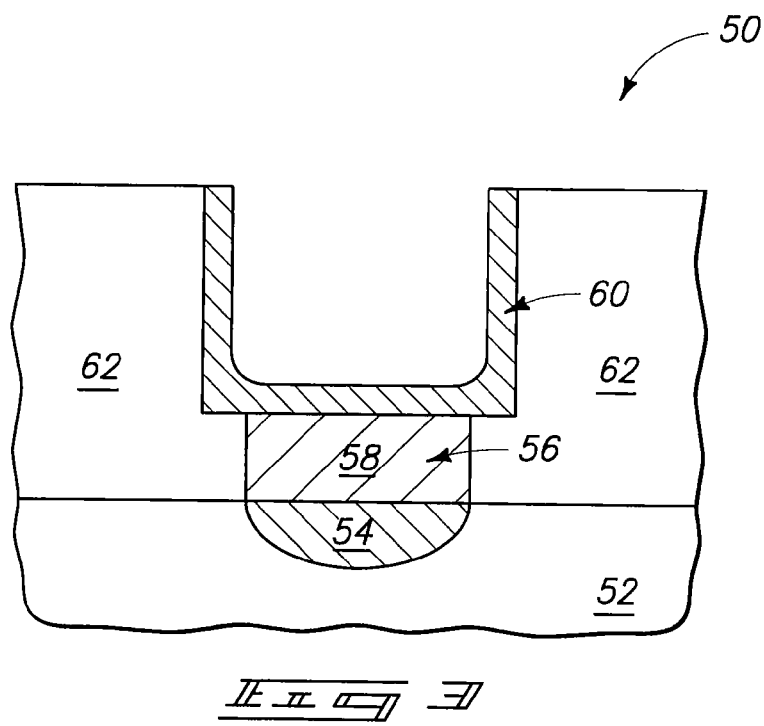
_FIG_ 3
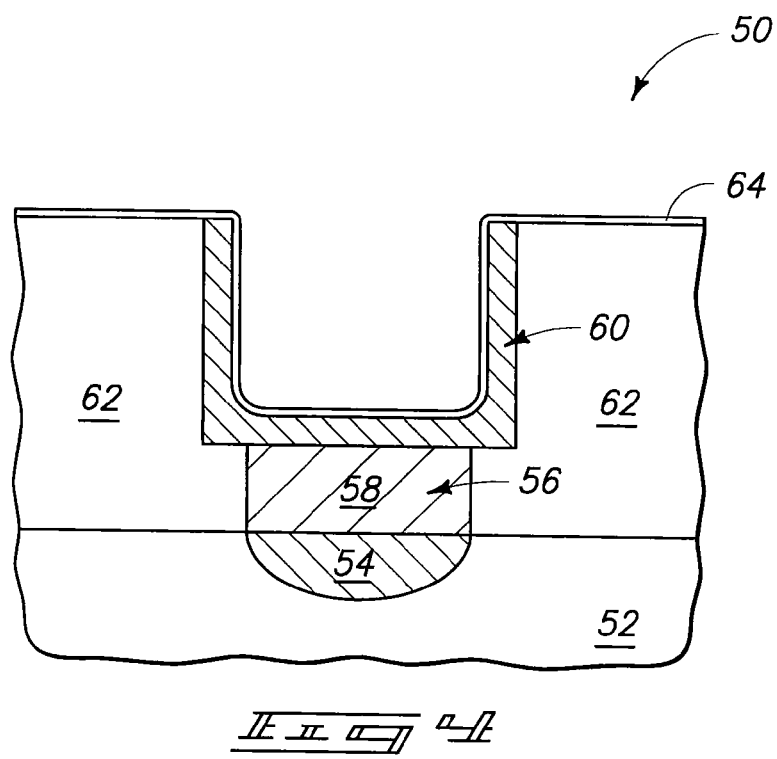
_FIG_ 4

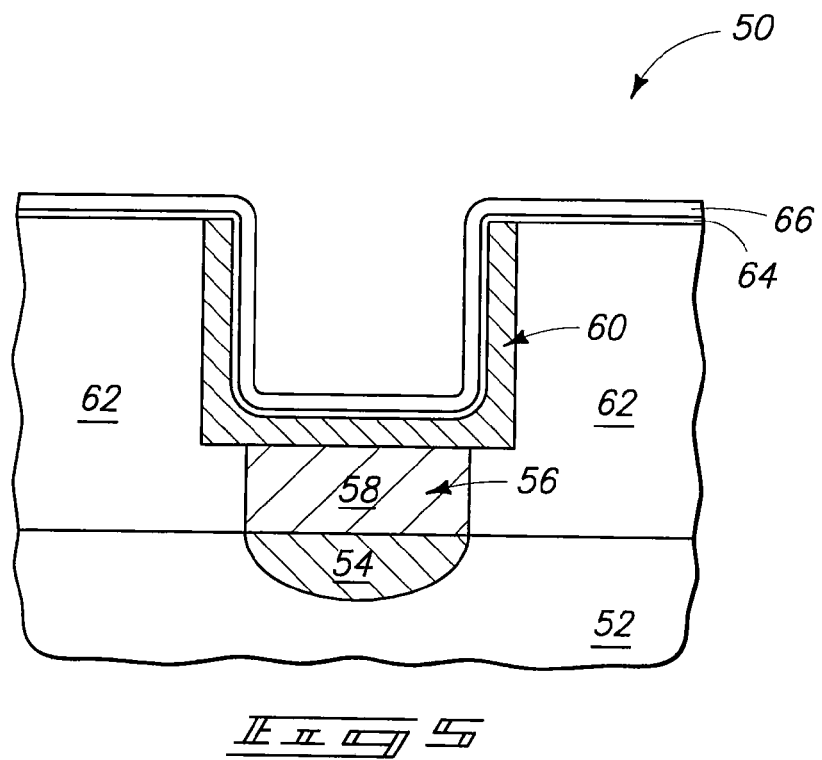
_FIG 5_
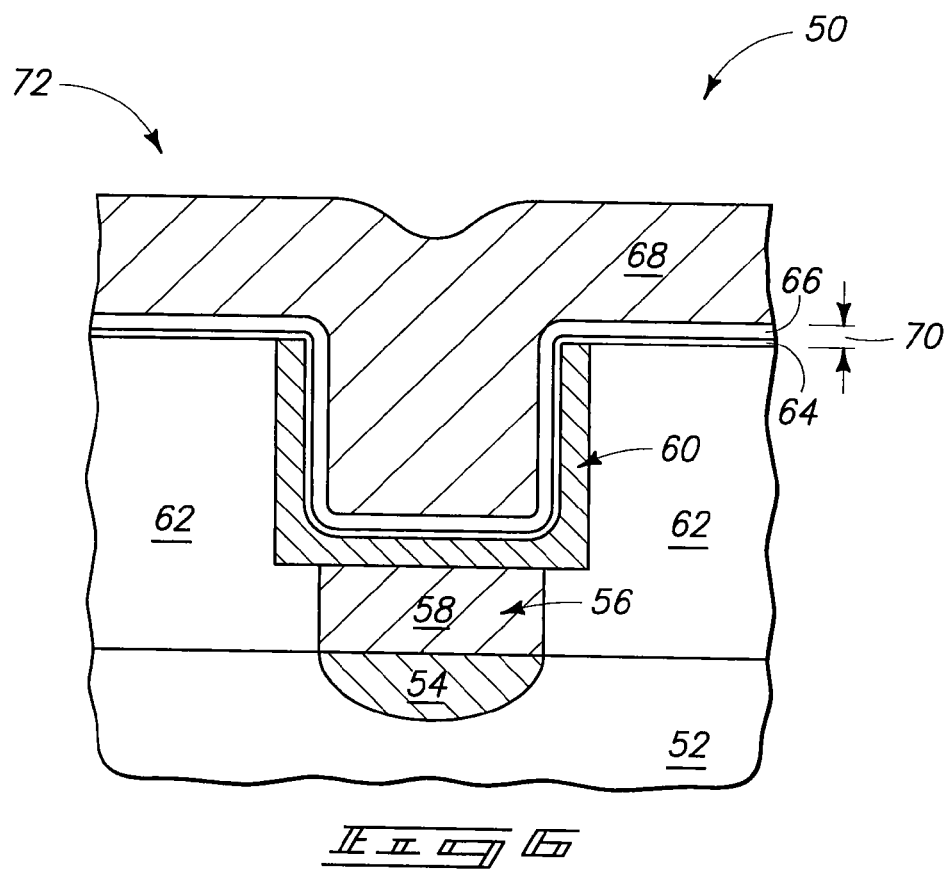
_FIG 6_

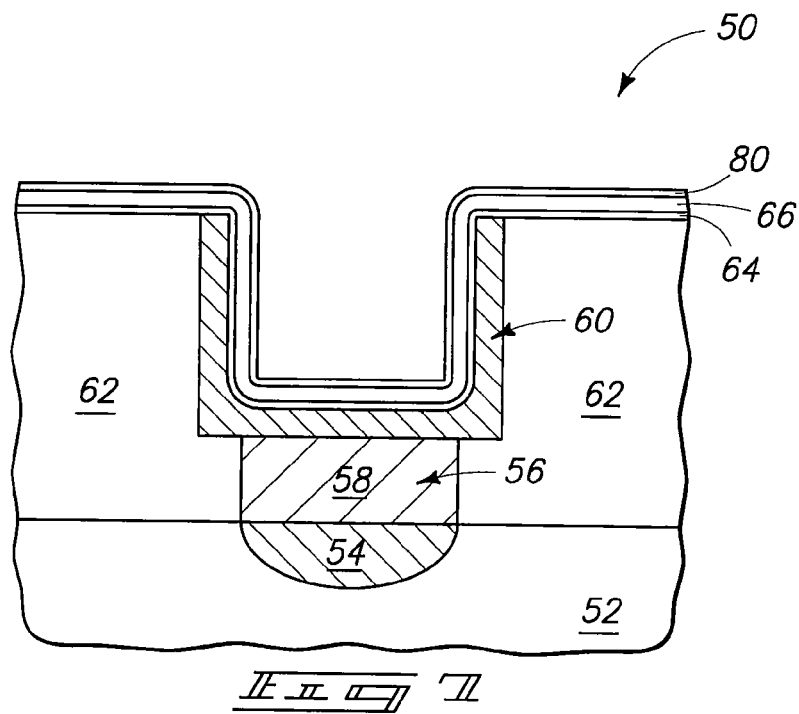
F I G 7
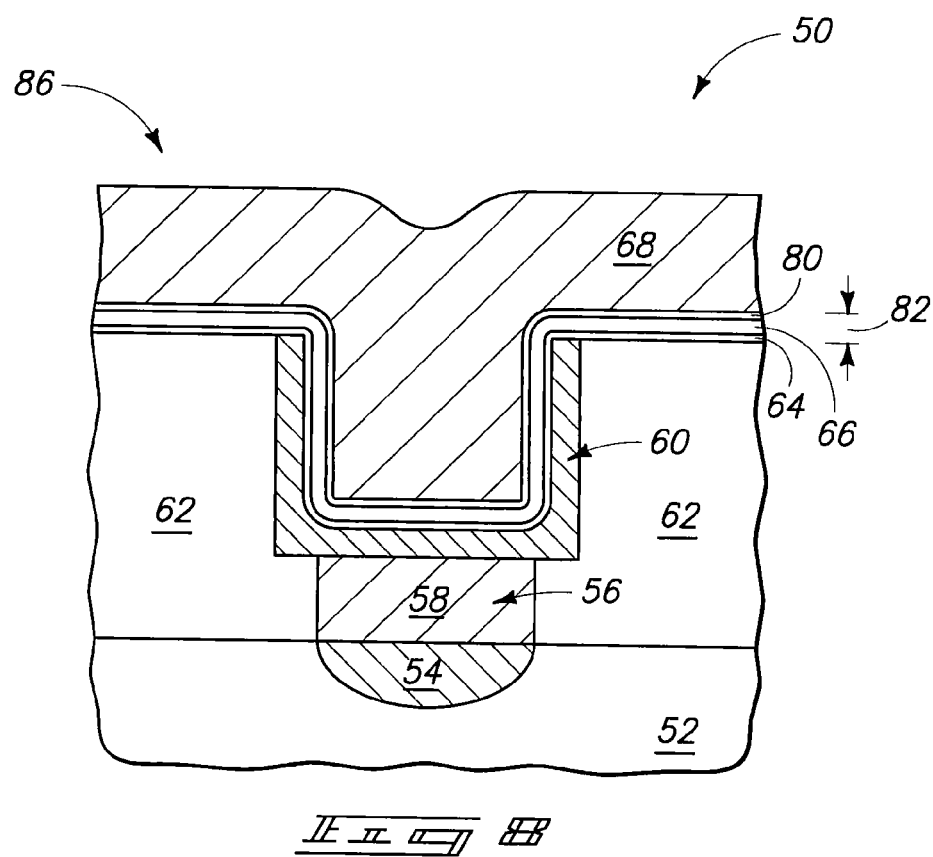
F I G 8

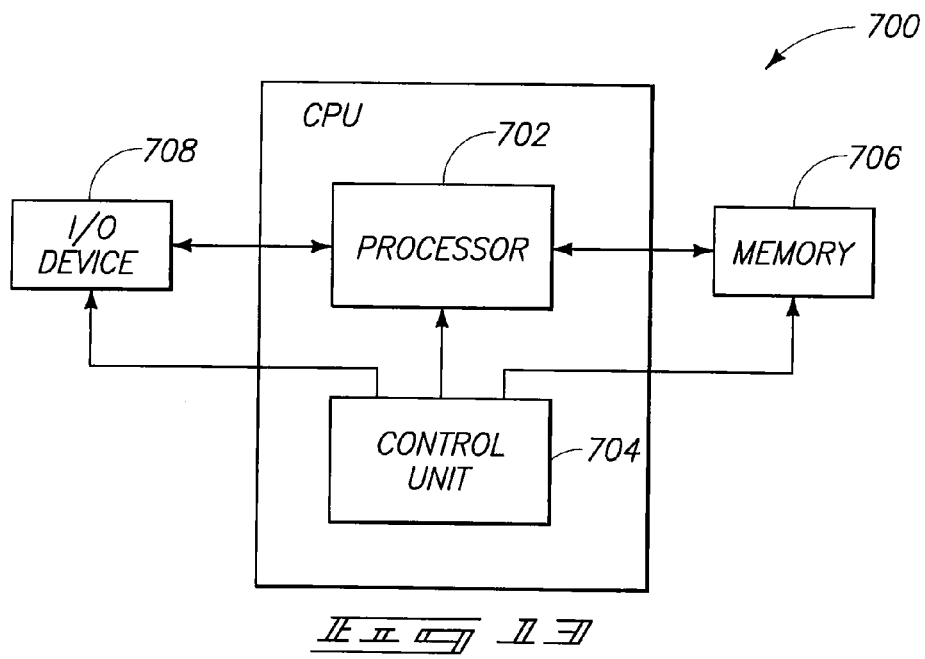
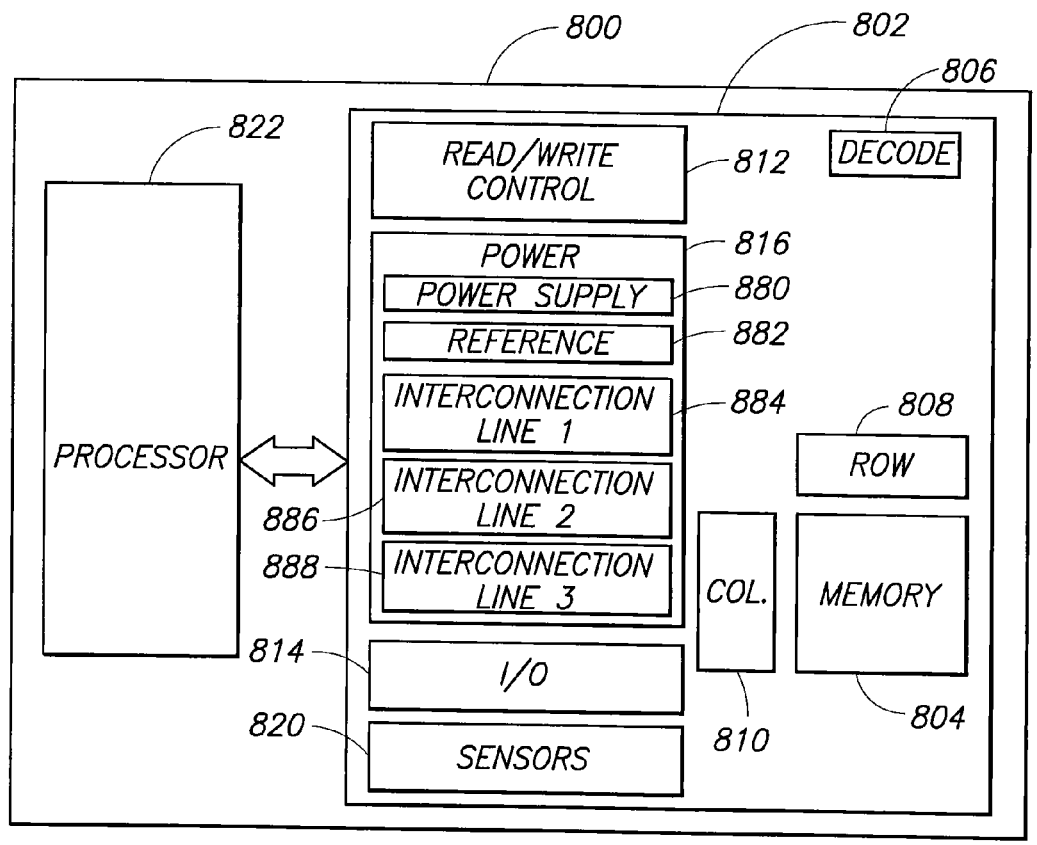

METHODS OF FORMING DIELECTRIC MATERIAL-CONTAINING STRUCTURES

RELATED PATENT DATA

This patent resulted from a continuation of U.S. patent application Ser. No. 12/251,733, which was filed Oct. 15, 2008, which issued as U.S. Pat. No. 7,820,506, and which is hereby incorporated herein by reference.

TECHNICAL FIELD

Capacitors, dielectric structures, and methods of forming dielectric structures.

BACKGROUND

Dielectric materials have numerous applications in integrated circuitry. For instance, dielectric materials may be incorporated into capacitors, may be utilized as gate dielectric of field effect transistors, may be utilized as intergate dielectric of non-volatile transistors, and may be utilized for electrically isolating adjacent semiconductor components from one another.

The dielectric properties of dielectric materials can be expressed in terms of a dielectric constant. The dielectric constant (k) is the ratio of the permittivity of a substance to the permittivity of free space. It is an expression of the extent to which a material concentrates electric flux. As the dielectric constant increases, the electric flux density increases, if all other factors remain unchanged. Accordingly, a thick layer of a material having a high dielectric constant may be utilized to achieve the same electric flux density as a thin layer of a material having a lower dielectric constant.

There is a continuing goal to increase integration density, and a corresponding goal to reduce the size of individual integrated circuit components. Accordingly, there is interest in utilizing dielectric materials having high dielectric constants in integrated circuitry, in that such materials may increase the electric flux density to compensate for reduced area in order to achieve desired operational properties.

Unfortunately, materials with high dielectric constants tend to break down more easily when subjected to intense electric fields than do materials with low dielectric constants. Also, materials with high dielectric constants tend to have high dielectric dispersion, and slow dielectric relaxation.

Dielectric dispersion (permittivity as a function of frequency) is fundamental to any material system because there are multiple mechanisms that contribute to capacitance at lower frequencies, and which decrease with increasing frequency. If dielectric dispersion is high, the response rate of a dielectric material is more altered by changes in frequency then if the dielectric dispersion is low.

Dielectric relaxation is a parameter utilized to express the dielectric response in the time domain to apply (or remove) electric field (e.g., the rate at which charge is stored or released from a capacitor). If dielectric relaxation is slow, the response time will be long. Materials with high dielectric constants tend to have slower response times than do materials with lower dielectric constants.

One of the uses of dielectric materials is in capacitors of dynamic random access memory (DRAM) unit cells. In such applications, it is desired that the dielectric materials store a large quantity of flux in a small volume, and yet have a rapid response time (i.e., rapidly store or release charge). As discussed above, materials with high dielectric constants may store a large quantity of flux in a small volume, but tend to have relatively slow response times.

It would be desirable to develop dielectric structures that have the desired properties of high dielectric materials, and yet that also have better response times than do materials with high dielectric constants. Such dielectric structures will be useful for capacitors of integrated circuitry for the reasons discussed above, and may also have application for utilization in other components of integrated circuitry, such as, for example, for utilization as gate dielectric and/or for utilization as intergate dielectric.

BRIEF DESCRIPTION OF THE DRAWINGS

FIGS. 3-6 are diagrammatic, cross-sectional views of a portion of a semiconductor construction illustrating various process stages of an example embodiment method for forming a capacitor.

FIGS. 7 and 8 are diagrammatic, cross-sectional views of a portion of a semiconductor construction illustrating various process stages of another example embodiment method for forming a capacitor, with the process stage of FIG. 7 being subsequent to that of FIG. 5.

FIG. 13 is a high level block diagram of an electronic system embodiment.

FIG. 14 is a simplified block diagram of a memory device embodiment.

DETAILED DESCRIPTION OF THE ILLUSTRATED EMBODIMENTS

In some embodiments, improved dielectric structures are formed which have high charge storage capacity, and yet which also have rapid response time. Conventional approaches to development of improved dielectric structures seek to either achieve high storage capacity, or rapid response time. In some embodiments, an approach is utilized for development of improved dielectric structures in which a compromise is reached between charge storage and response time in an effort to develop dielectric structures suitable for a wide variety of applications. The approach may comprise forming the dielectric structures to have different compositions along edges of the structures than along interiors of the structures, so that charge stays primarily along the edges of the structures during utilization of the structures.

When dielectric structures are utilized in capacitors, the capacitors may be characterized in terms of capacitance relative to frequency. The capacitance is a measure of the charge storage capability of the dielectric structures, and the relation of the capacitance to frequency is a measure of the response speed of the dielectric structures. The capacitance relative to frequency may be designated by the symbol "CF". In some embodiments, the approach utilized to develop improved dielectric structures may be considered to be development of CF-tunability of the dielectric structures. The CF-tunability may enable dielectric structures to be designed for particular operational parameters at particular polarities, which may enable the dielectric structures to be tailored for particular applications.

Example embodiments are described with reference to FIGS. 1-14.

Figure 1:
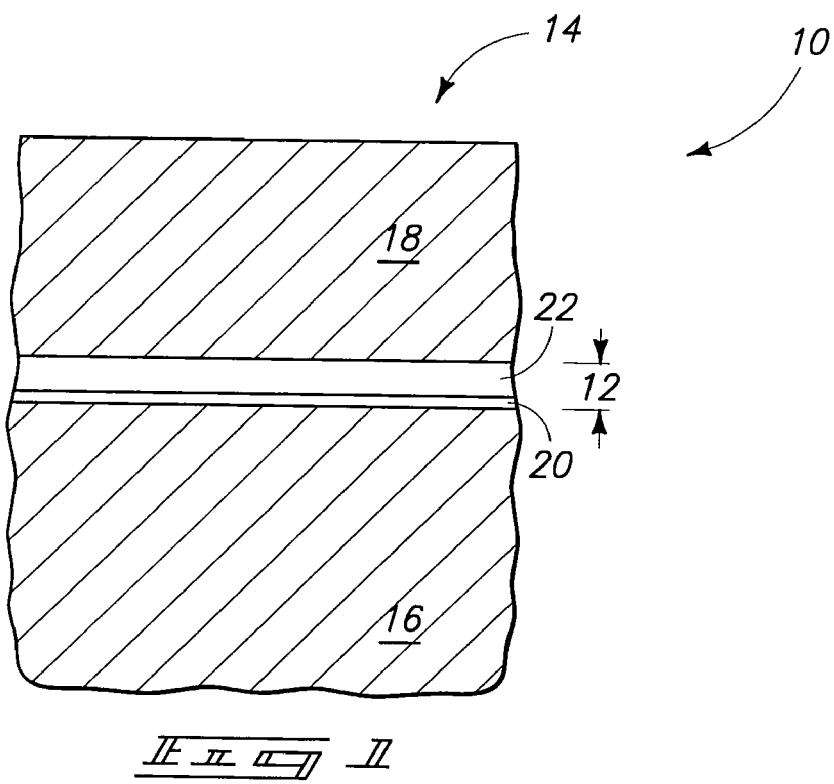
FIG. 1 is a diagrammatic, cross-sectional view of a portion of a semiconductor construction illustrating a capacitor comprising an example embodiment dielectric structure.

Referring to FIG. 1, a portion of a semiconductor construction 10 is illustrated. The construction 10 has an example embodiment dielectric structure 12 incorporated into a capacitor 14.

The capacitor 14 has a first capacitor electrode 16 beneath the dielectric structure 12, and has a second capacitor electrode 18 over the dielectric structure. Accordingly, the dielectric structure 12 may be considered to be sandwiched between the first and second capacitor electrodes.

The first and second capacitor electrodes 16 and 18 may comprise any suitable electrically conductive composition, or combination of electrically conductive compositions. In some embodiments, the capacitor electrodes may comprise, consist essentially of, or consist of one or more of various metals (for instance, tungsten, titanium, platinum, etc.), metal-containing compositions (for instance, metal silicide, metal nitride, etc.), and conductively-doped semiconductor materials (for instance, conductively-doped silicon, conductively-doped germanium, etc.). The first and second capacitor electrodes may be the same as one another in composition, or may have different compositions relative to one another.

Dielectric structure 12 includes a first portion 20 adjacent the capacitor electrode 16, and a second portion 22 which is directly against the first portion. The first portion 20 is a mixed phase portion, and specifically is a homogeneous mixture of at least two phases; and the second portion 22 is a single phase portion, and may consist of a composition having a dielectric constant of greater than or equal to 25.

In some embodiments, mixed phase portion 20 will be amorphous, and single phase portion 22 will be crystalline. In such embodiments, mixed phase portion 20 may be entirely amorphous (i.e., non-crystalline), and portion 22 may be entirely crystalline (either monocrystalline or polycrystalline). Alternatively, the single phase portion 22 may be relatively more crystalline than the mixed phase portion 20; even though the mixed phase portion 20 may have some crystalline character and/or the single phase portion 22 may have some amorphous character. In some embodiments, mixed phase portion 20 will be at least about 90 volume percent amorphous, and single phase portion 22 will be at least about 90 volume percent crystalline.

The amorphous state of the mixed phase portion may be due to mixing of the two or more phases of such portion. Specifically, each of the phases may be intrinsically crystalline, but the mixing of the phases may lead to the phases disrupting the crystalline structures of one another and thereby causing the first portion 20 to be amorphous.

A first of the at least two phases of the first portion 20 may be a metal oxide having a dielectric constant of greater than or equal to 25, while a second of the at least two phases may be a metal oxide having a dielectric constant of less than or equal to 20, and in some embodiments, less than or equal to about 9. In some embodiments, the first portion 20 may consist of a mixture selected from the group consisting of ZrAlO, HfAlO, ZrSiO, HfSiO, ZrHfO, ZrTaO, HfTaO, ZrTiO, HfTiO, TaTiO, HfTaTiO and ZrTaTiO; where the chemical formulas indicate the elements contained in the mixtures and do not imply any particular stoichiometry of such elements. The stoichiometry of the compositions within the listed mixtures may be any suitable stoichiometries. For instance, the ZrAlO may be a mixture of $ZrO_2$ and $Al_2O_3$. As another example, the ZrTaO may be a mixture of $ZrO_2$ and $Ta_2O_5$.

In some embodiments, the first portion 20 may comprise a homogeneous mixture of at least two metal oxides; with one of the metal oxides having a dielectric constant of greater than or equal to 25, and the other having a dielectric constant of less than or equal to 20. The metal oxide having the dielectric constant greater than or equal to 25 may be considered to be a high-k component of the first portion 20, while the metal oxide having the dielectric constant less than 20 may be considered to be a mid-k component of the first portion. In some embodiments, the mid-k component will have a dielectric constant of from about 4 to about 20, and in some embodiments the mid-k component will have a dielectric constant that is less than or equal to about 9.

Although the portion 20 may comprise a mixture of more than two metal oxides, in some embodiments the portion 20 will be a homogeneous mixture consisting of only two metal oxides, with one of the metal oxides being a high-k component and the other being a mid-k component. The relative amount of the mid-k component to the high-k component may be tailored to achieve a desired performance of the dielectric structure 12. For instance, if portion 20 consists of a homogeneous mixture of zirconium oxide and aluminum oxide (in other words, consists of ZrAlO; where the chemical formula indicates the elements contained in the mixture and does not imply any particular stoichiometry of such elements), the aluminum may be present to a concentration of from about 10 atomic percent to about 50 atomic percent.

The second portion 22 of the dielectric structure 12 may comprise any suitable composition. In some embodiments, the composition of the second portion 22 will be the same as one or more high-k components of the first portion 20, and in other embodiments the composition of the second portion 22 will be different from all of the components of the first portion 20.

In some embodiments, the composition of the second portion 22 is selected from the group consisting of ZrO, HfO, TaO, TiO and SrTiO; where the chemical formulas indicate the elements contained in the compositions and do not imply any particular stoichiometry of such elements.

The relative thicknesses of portions 20 and 22 in dielectric structure 12 may be tailored to achieve a desired relationship between response time and capacitance. In some embodiments, portion 20 may have a thickness of from about 10 angstroms to about 40 angstroms, while portion 22 has a thickness of from about 40 angstroms to about 120 angstroms. Accordingly, in some embodiments the thickness of portion 20 will correspond to from about 10 percent to about 50 percent of the total thickness of dielectric structure 12.

In some embodiments, the mixed phase portion 20 of dielectric structure 12 may be considered to be a barrier between the single phase portion 22 of the dielectric structure 12, and the capacitor electrode 16. The tailoring of the composition of portion 20, and the tailoring of the relative thickness of portion 20 to portion 22, may be considered to be barrier engineering of a dielectric stack (with such dielectric stack corresponding to the dielectric structure 12). The barrier engineering may be utilized to achieve a desired relationship of response time to capacitance for the capacitor 14 containing the dielectric structure 12.

In the shown embodiment, the mixed phase first portion 20 of dielectric structure 12 is directly against bottom capacitor electrode 16, and there is no mixed phase portion between the single phase portion 22 of dielectric structure 12 and the upper capacitor electrode 18. Such embodiment may be utilized if a capacitor is primarily operated in a particular polarity between electrodes 16 and 18. If the capacitor is operated in an opposing polarity between electrode 16 and 18, the capacitor may be formed so that the mixed phase portion of dielectric structure 12 is between the upper electrode and the single phase portion of the dielectric structure (in other words, the dielectric structure 12 may be formed so that the mixed phase first portion 20 is over the single phase second portion 22, rather than the shown configuration in which the mixed phase first portion 20 is under the single phase second portion 22).

The shown configuration implies that the mixed phase portion 20 of the dielectric structure 12 is formed before the single phase portion 22. If dielectric structure 12 is inverted so that the mixed phase portion 20 is over the single phase portion 22, then the mixed phase portion 20 may be formed after the single phase portion 22.

Portions 20 and 22 of dielectric structure 12 may be formed utilizing any suitable processing.

In some embodiments, the single phase portion 22 of dielectric structure 12 may be formed utilizing one or both of chemical vapor deposition (CVD) and atomic layer deposition (ALD). In some embodiments, the bottom capacitor electrode may have an undulating topography rather than the shown planar topography, and in such embodiments it may be desirable to utilize ALD rather than CVD due to enhanced step coverage that may be achieved utilizing ALD.

In some embodiments, the mixed phase portion 20 of the dielectric structure 12 may be formed utilizing ALD under conditions in which a mixed metal oxide is formed rather than separate layers of different metal oxides. Specifically, the ALD of a mixed metal oxide of portion 20 may comprise utilization of multiple pulses of a first metal-containing precursor, a second metal-containing precursor, and one or more oxygen-containing reactants; where one of the first and second metal-containing precursors forms the metal of the high-k oxide, and the other of the first and second metal-containing precursors forms the metal of the mid-k oxide. The pulses are conducted in a reaction chamber. The first metal-containing precursor may be pulsed into the chamber under conditions which form a less than fully saturated monolayer across a surface of a substrate. Subsequently, the second metal-containing precursor may be pulsed into the chamber to complete saturation of the monolayer, and to thus form a monolayer that consists of a homogeneous mixture of the two different metals provided by the first and second metal-containing precursors. Subsequently, oxygen-containing reactant may be pulsed into the chamber to convert the monolayer into a homogeneous mixture of high-k oxide and mid-k oxide. The pulse sequence may be repeated multiple times to form portion 20 to a desired thickness.

The pulse sequence utilizing the order of pulses corresponding to the first metal-containing precursor, the second metal-containing precursor, and then the oxidant may be referred to as an $M_1$-$M_2$-O sequence to indicate that the two metals are provided before the oxidation (where $M_1$ represents the first metal-containing precursor, $M_2$ represents the second metal-containing precursor, and O represents the oxidant). Another pulse sequence that may be utilized is $M_1$-O-$M_2$-O. In such pulse sequence, the partially saturated monolayer formed from the first metal-containing precursor is oxidized prior to provision of the second metal-containing precursor. In some embodiments, the two pulse sequences of $M_1$-$M_2$-O and $M_1$-O-$M_2$-O may be utilized interchangeably in forming portion 20 of dielectric structure 12 to a desired thickness. If more than two metals are to be utilized in the mixed phase portion 20, the ALD pulse sequences may be modified to accommodate more than two metal-containing precursors.

Figure 2:
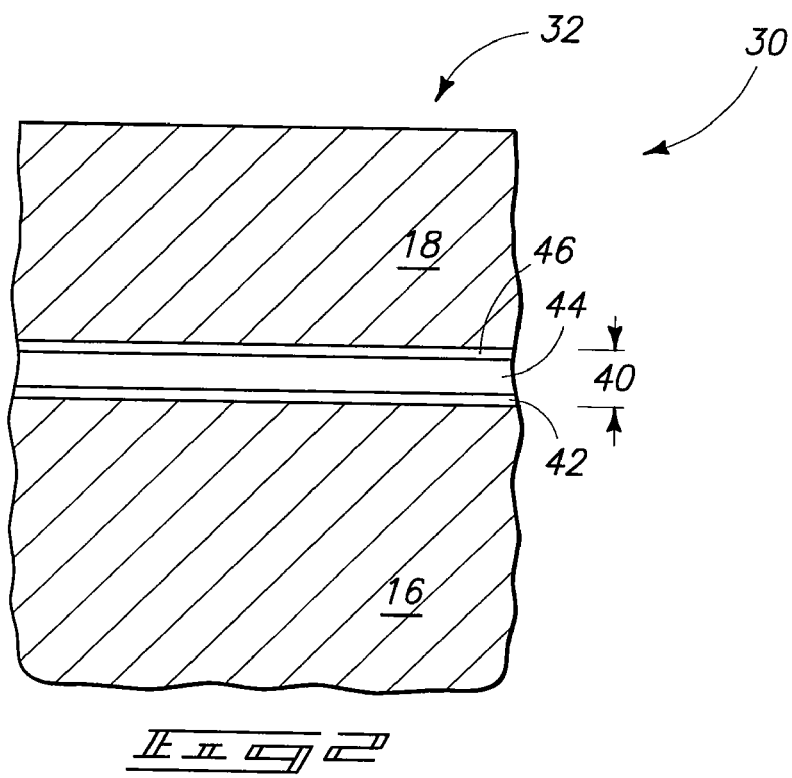
FIG. 2 is a diagrammatic, cross-sectional view of a portion of a semiconductor construction illustrating a capacitor comprising another example embodiment dielectric structure.

The capacitor 14 of FIG. 1 utilizes a dielectric structure containing only a single mixed phase portion 20. In other embodiments, the dielectric structure may comprise a pair of mixed phase portions configured so that each of the capacitor electrodes is spaced from the single phase (and possibly crystalline) portion of the dielectric structure by an multi-phase (and possibly amorphous) barrier. FIG. 2 shows a portion of a semiconductor construction 30 illustrating an example embodiment in which a dielectric structure comprises two mixed phase portions. Similar numbering will be used to describe the construction 30 of FIG. 2 as was used to describe the construction 10 of FIG. 1, where appropriate.

The construction 30 has an example embodiment dielectric structure 40 incorporated into a capacitor 32.

The capacitor 32 has the first capacitor electrode 16 beneath the dielectric structure 40, and has the second capacitor electrode 18 over the dielectric structure.

Dielectric structure 40 includes a first portion 42 adjacent the capacitor electrode 16, a second portion 44 which is over and directly against the first portion, and a third portion 46 which is over and directly against the second portion. The first and third portions 42 and 46 are homogeneous mixtures of at least two phases, and may be amorphous. The first and third portions may be identical in composition to one another, or may be different compositions relative to one another. The second portion 44 consists of a composition having a dielectric constant of greater than or equal to 25, and may be crystalline.

The mixed phase portions 42 and 46 of dielectric structure 40 may comprise the mixed metal oxides discussed above regarding the mixed phase portion 20 of dielectric structure 12. Accordingly, the mixed phase portions 42 and 46 may comprise a homogeneous mixture of at least two oxides, with one of the oxides being a high-k oxide and the other being a mid-k oxide. In some embodiments, mixed phase portions 42 and 46 may consist of mixtures selected from the group consisting of ZrAlO, HfAlO, ZrSiO, HfSiO, ZrHfO, ZrTaO, HfTaO, ZrTiO, HfTiO, TaTiO, HfTaTiO and ZrTaTiO; where the chemical formulas indicate the elements contained in the mixtures and do not imply any particular stoichiometry of such elements.

The single phase portion 44 of dielectric structure 40 may comprise any of the compositions discussed above regarding the single phase portion 22 of dielectric structure 12. Accordingly, the single phase portion 44 of dielectric structure 40 may consist of a composition selected from the group consisting of ZrO, HfO, TaO, TiO and SrTiO; where the chemical formulas indicate the elements contained in the compositions and do not imply any particular stoichiometry of such elements.

In some embodiments, mixed phase portions 42 and 46 will be entirely amorphous (i.e., non-crystalline) and single phase portion 44 will be entirely crystalline (either monocrystalline or polycrystalline). In other embodiments, one or both of portions 42 and 46 may have some crystalline character; and portion 44 may have some amorphous character, but portions 42 and 46 will be relatively less crystalline than portion 44. In some embodiments, portions 42 and 46 will be at least about 90 volume percent amorphous, and portion 44 will be at least about 90 volume percent crystalline.

The relative thicknesses of portions 42, 44 and 46 in dielectric structure 40 may be tailored to achieve a desired relationship between response time and capacitance. In some embodiments, portions 42 and 46 may have thicknesses of from about 10 angstroms to about 40 angstroms, while portion 44 has a thickness of from about 40 angstroms to about 120 angstroms. The mixed phase portions 42 and 46 may have the same thickness as one another, or may have different thicknesses relative to one another.

In some embodiments, mixed phase portions 42 and 46 of dielectric structure 40 may be considered to be engineered barriers between the single phase portion 44 of the dielectric structure 40, and the capacitor electrodes 16 and 18. The tailoring of the compositions of portions 42 and 46, and the tailoring of the thicknesses of portions 42 and 46, may be considered to be barrier engineering of a dielectric stack. Such barrier engineering may be utilized to achieve a desired relationship of response time to capacitance for the capacitor 32 containing the dielectric structure 40.

The mixed phase portions 42 and 46 of dielectric structure 40 may be formed utilizing processing of the type described above with reference to formation of the mixed phase portion 20 of FIG. 1; and the single phase portion 44 of dielectric structure 40 may be formed utilizing processing of the type described above with reference to formation of the single phase portion 22 of FIG. 1.

The dielectric structures 12 and 40 of FIGS. 1 and 2, respectively, may enable high capacitance to be achieved, while also enabling rapid response times to be achieved. A possible mechanism for the action of the dielectric structures is that the engineered barrier materials alleviate or prevent charge-injection from the capacitor electrodes into conduction bands or traps of the materials of the dielectric structure. Low trap density near a Fermi level may be particularly useful for improvement of CF at about zero volts, while low trap density above or below the Fermi level may be particularly useful under +/−1.5 volt CF, and under +/−0.75 volt CF. If traps are easily populated due to energy, proximity or density, and trap-hopping occurs under alternating current modulation, especially near an electrode, than low-frequency capacitance response may be enhanced. However, this may not provide a high-frequency capacitance response, and may degrade high-frequency capacitance response (or dielectric response time) due to local field degradation from inserted charges.

FIGS. 1 and 2 illustrate dielectric structures comprising two portions and three portions, respectively. In some embodiments, dielectric structures may comprise more than three portions. For instance, the two portions of FIG. 1 may be alternated throughout a dielectric structure to form the structure to comprise four or more portions. As another example, multiple different single phase portions may be used in a dielectric structure analogous to that of FIG. 2, with all of such single phase portions being sandwiched between a pair of mixed phase portions.

Dielectric structures analogous to the structures 12 and 40 of FIGS. 1 and 2 may be utilized in numerous semiconductor applications. For instance, the dielectric structures may be incorporated into capacitors of DRAM. FIGS. 3-6 illustrate an example embodiment for fabricating a DRAM capacitor to comprise a barrier-engineered dielectric structure.

Referring to FIG. 3, a portion of a semiconductor construction 50 is shown. The construction 50 comprises a semiconductor substrate 52 having a conductively-doped diffusion region 54 extending therein.

Substrate 52 may comprise, consist essentially of, or consist of, for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

Conductively-doped diffusion region 54 may be either n-type majority doped or p-type majority doped, and may be a source/drain region of a transistor. Such transistor may have a transistor gate (not shown) that is out of the page relative to the cross-section of FIG. 3, and may gatedly connect diffusion region 54 with another diffusion region (not shown) on an opposing side of the transistor gate from region 54. The other source/drain region may be electrically connected to a bitline (not shown), and the transistor gate may be part of a wordline.

An electrically conductive pedestal 56 extends upwardly from diffusion region 54, and electrically connects with diffusion region 54. Pedestal 56 comprises a conductive material 58. Such conductive material may be any suitable electrically conductive composition or combination of compositions; and may, for example, comprise, consist essentially of, or consist of one or more of various metals (for instance, tungsten, titanium, platinum, etc.), metal-containing compositions (for instance, metal silicide, metal nitride, etc.), and conductively-doped semiconductor materials (for instance, conductively-doped silicon, conductively-doped germanium, etc.).

An electrically conductive capacitor electrode 60 is over pedestal 58, and in electrical contact with pedestal 58. Electrode 60 may be referred to as a capacitor storage node, and may comprise any of the compositions discussed above with reference to capacitor electrodes 16 and 18 of FIG. 1. The shown electrode 60 is container-shaped. In other embodiments, the electrode may have other shapes, including, for example, a pillar shape of a stud-type electrode. The capacitor electrode 60 may be referred to as a first capacitor electrode to distinguish it from another capacitor electrode (discussed below) that will be subsequently formed.

An electrically insulative material 62 laterally surrounds pedestal 56 and capacitor electrode 60. The electrically insulative material may comprise any suitable composition or combination of compositions; and in some embodiments may comprise, consist essentially of, or consist of one or more of silicon dioxide, silicon nitride, and various doped silicon oxides (for instance, borophosphosilicate glass, fluorosilicate glass, etc.).

Referring to FIG. 4, a dielectric material 64 is formed over capacitor electrode 60. The dielectric material 64 is a mixed phase material, and may comprise any of the compositions discussed above relative to the mixed phase portion 20 of the dielectric structure 12 of FIG. 1. The dielectric material 64 may be formed utilizing one or both of the $M_1$-$M_2$-O and $M_1$-O-$M_2$-O ALD methodologies discussed above relative to fabrication of the mixed phase portion 20 of the dielectric structure 12 of FIG. 1. The dielectric material 64 may be amorphous.

Referring to FIG. 5, a single phase dielectric material 66 is formed over the mixed phase dielectric material 64. The single phase dielectric material 66 may comprise any of the compositions discussed above relative to the single phase portion 22 of the dielectric structure 12 of FIG. 1, and may be formed utilizing any of the methods discussed above for formation of portion 22 of FIG. 1. The single phase dielectric material 66 may be crystalline.

Referring to FIG. 6, a second capacitor electrode 68 is formed over the single phase dielectric material 66. The second capacitor electrode may comprise any of the compositions discussed above with reference to capacitor electrodes 16 and 18 of FIG. 1, and may be referred to as a capacitor plate.

The mixed phase dielectric material 64 and the single phase dielectric material 66 together form a dielectric structure 70 between the capacitor electrodes 60 and 68. The dielectric structure 70 is analogous to the dielectric structure 12 of FIG. 1, and may be tailored to achieve a desired balance between capacitance and response time analogously to the tailoring discussed above with reference to FIG. 1.

The capacitor electrodes 60 and 68, together with dielectric structure 70, form a capacitor 72. Such capacitor may be incorporated into a DRAM unit cell. The DRAM unit cell may be part of a DRAM array, and may be one of numerous identical unit cells that are simultaneously formed during fabrication of a DRAM array.

The capacitor 72 utilizes a dielectric structure 70 analogous to the dielectric structure 12 of FIG. 1 (in other words, a dielectric structure having only a single mixed phase portion). In other embodiments, a capacitor may be formed that utilizes a dielectric structure analogous to the structure of FIG. 2 (in other words, a dielectric structure comprising a pair of mixed phase portions). FIG. 7 shows construction 50 at a processing stage subsequent to that of FIG. 5 in accordance with an embodiment in which the dielectric structure will utilize a pair of mixed phase portions.

The construction 50 of FIG. 7 has a mixed phase dielectric material 80 formed over and directly against the single phase dielectric material 66. The mixed phase dielectric material 80 may comprise any of the compositions discussed above relative to the mixed phase portion 20 of FIG. 1; and may be formed utilizing the ALD processes discussed above with reference to FIG. 1 for formation of mixed phase portion 20.

Referring to FIG. 8, a second capacitor electrode 68 is formed over mixed phase dielectric material 80. The dielectric compositions 64, 66 and 80 together form a dielectric structure 82 between the first and second capacitor electrodes 66 and 68. The first and second capacitor electrodes, together with the dielectric structure, form a capacitor construction 86. Such capacitor construction may be incorporated into a DRAM unit cell.

Figure 9:
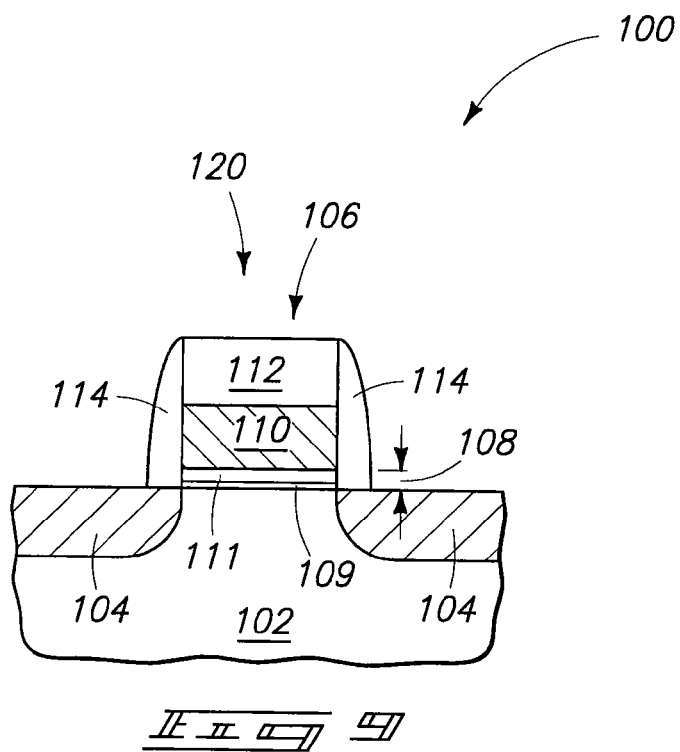
FIG. 9 is a diagrammatic, cross-sectional view of a portion of a semiconductor construction illustrating a field effect transistor comprising an example embodiment dielectric structure.
Figure 10:
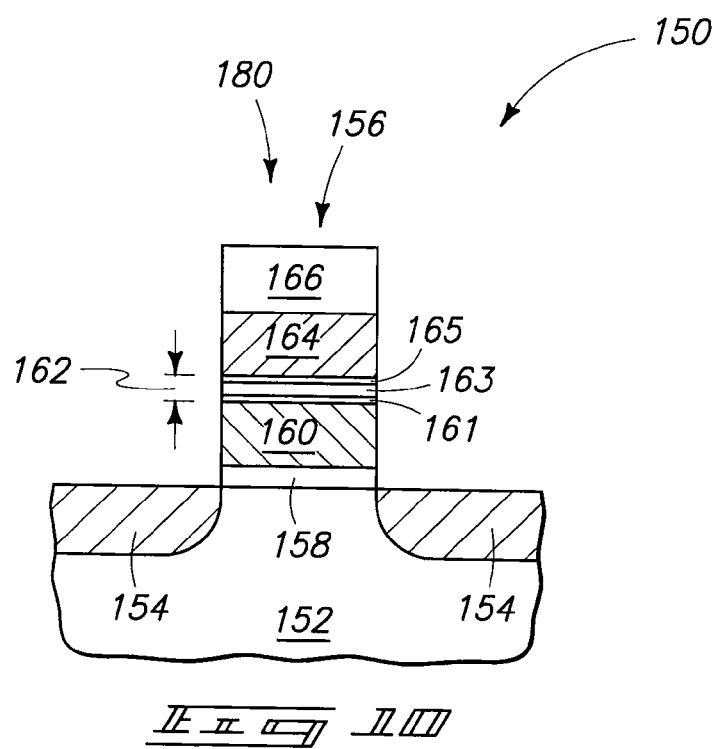
FIG. 10 is a diagrammatic, cross-sectional view of a portion of a semiconductor construction illustrating a non-volatile transistor comprising an example embodiment dielectric structure.

Barrier engineered dielectric structures may be utilized in other components besides capacitors. FIGS. 9 and 10 illustrate a field effect transistor and a non-volatile transistor, respectively, that utilize barrier engineered dielectric structures.

Referring to FIG. 9, such shows a portion of a semiconductor construction 100. The semiconductor construction includes a semiconductor substrate 102, and a pair of source/drain regions 104 that extend into the substrate. The source/drain regions are conductively-doped regions of substrate 102, and may be either majority n-type doped or majority p-type doped.

A transistor gate stack 106 is over substrate 102, and between the source/drain regions 104. The gate stack includes a dielectric structure 108, an electrically conductive gate material 110 over the dielectric structure, and an electrically insulative capping material 112 over the electrically conductive gate material. A pair of sidewall spacers 114 are along sidewalls of the gate stack 106. The gate stack 106 and source/drain regions 104 are together comprised by a field effect transistor 120.

The dielectric structure 108 is shown to comprise a pair of portions 109 and 111. One of the portions 109 and 111 is a mixed phase portion analogous to the portion 20 of FIG. 1, and the other is a single phase portion analogous to the portion 22 of FIG. 1. In some embodiments, it may be desired to have the mixed phase portion be along and directly against the substrate 102, and in other embodiments it may be desired to have the mixed phase portion be along and directly against the conductive gate material 110.

In some embodiments, the mixed phase portion of dielectric structure 108 will be entirely amorphous (i.e., non-crystalline) and the single phase portion of the dielectric structure will be entirely crystalline (either monocrystalline or polycrystalline). In other embodiments, the mixed phase portion may have some crystalline character and the single phase portion may have some amorphous character, but the single phase portion will be relatively more crystalline than mixed phase portion. In some embodiments, the mixed phase portion will be at least about 90 volume percent amorphous, and the single phase portion will be at least about 90 volume percent crystalline.

The dielectric structure 108 is a gate dielectric for the field effect transistor 120. The utilization of a dielectric structure having a mixed phase portion and a single phase portion analogous to the portions 20 and 22 of FIG. 1 enables the gate dielectric to be tailored for specific applications of the field effect transistor.

Although the dielectric structure 108 is shown to comprise two portions analogous to the portions 20 and 22 of FIG. 1, in other embodiments the dielectric structure may comprise three portions analogous to the portions 42, 44 and 46 of FIG. 2.

The conductive gate material 110, capping material 112 and sidewall spacers 114 of the effect transistor 120 may comprise any suitable compositions or combinations of compositions. For instance, the conductive gate material may comprise one or more of various metals, metal-containing compositions, and conductively-doped semiconductor materials; and the capping material 112 and sidewall spacers 114 may comprise one or more of silicon dioxide, silicon nitride and silicon oxynitride.

Referring to FIG. 10, such shows a portion of a semiconductor construction 150. The semiconductor construction includes a semiconductor substrate 152, and a pair of source/drain regions 154 that extend into the substrate. The source/drain regions are conductively-doped regions of substrate 152, and may be either majority n-type doped or majority p-type doped.

A transistor gate stack 156 is over substrate 152, and between the source/drain regions 154. The gate stack includes, in ascending order from the substrate, a gate dielectric 158, an electrically conductive charge retaining material 160, a dielectric structure 162, an electrically conductive control gate material 164, and an electrically insulative capping material 166. The gate stack 156 and source/drain regions 154 are together comprised by a non-volatile transistor 180.

The dielectric structure 162 is shown to comprise three portions—161, 163 and 165. The portions 161 and 165 are mixed phase materials analogous to the portions 42 and 46 of FIG. 2, and the portion 163 is single phase material analogous to the portion 44 of FIG. 2.

The dielectric structure 162 is an intergate dielectric for the transistor 180. The utilization of a dielectric structure having mixed phase portions on opposing sides of a single phase portion (analogous to the portions 42, 44 and 46 of FIG. 2) enables the intergate dielectric to be tailored for specific applications of the transistor. The dielectric structure is referred to as an "intergate" structure because it is between charge-retaining material 160 and control gate material 164, and historically the charge-retaining material and control gate material were considered to correspond to two gates (a floating gate and a control gate). In modern structures, the charge-retaining material may be a charge-trapping material rather than corresponding to a floating gate, but the term "intergate" material is still utilized to refer to the material provided between the charge-retaining material and the control gate material.

In some embodiments, mixed phase portions 161 and 165 will be entirely amorphous (i.e., non-crystalline) and single phase portion 163 will be entirely crystalline (either monocrystalline or polycrystalline). In other embodiments, one or both of portions 161 and 165 may have some crystalline character; and portion 163 may have some amorphous character, but portion 163 will be relatively more crystalline than portions 161 and 165. In some embodiments, portions 161 and 165 will be at least about 90 volume percent amorphous, and portion 163 will be at least about 90 volume percent crystalline.

Although the dielectric structure 162 is shown to comprise three portions analogous to the portions 42, 44 and 46 of FIG. 2, in other embodiments the dielectric structure may comprise two portions analogous to the portions 20 and 22 of FIG. 1.

The gate dielectric 158 may comprise any suitable composition or combination of compositions. In some embodiments, the gate dielectric may comprise silicon dioxide. In some embodiments, the gate dielectric may comprise a dielectric structure analogous to the structure 12 of FIG. 1 or the structure 40 of FIG. 2.

The charge-retaining material 160 may comprise any suitable composition or combination of compositions. In some embodiments, the charge-retaining material may be polycrystalline silicon. In some embodiments, the charge-retaining material may comprise a charge-trapping composition.

The control gate material 164 may comprise any suitable composition or combination of compositions; and may, for example, comprise one or more of various metals, metal-containing compositions, and conductively-doped semiconductor materials.

The electrically insulative capping material 166 may comprise any suitable composition or combination of compositions, and may, for example, comprise one or more of silicon dioxide, silicon nitride and silicon oxynitride.

Although dielectric structure 162 is the only intergate dielectric in the shown embodiment, in other embodiments there may be additional dielectric materials utilized in combination with dielectric structure 162 between charge-retaining material 160 and control gate material 164.

The structures and devices of FIGS. 1-10 may be incorporated into electronic systems, such as cars, computers, telephones, etc. FIGS. 11-14 show example embodiments in which such structures and devices are incorporated into electronic systems.

Figure 11:
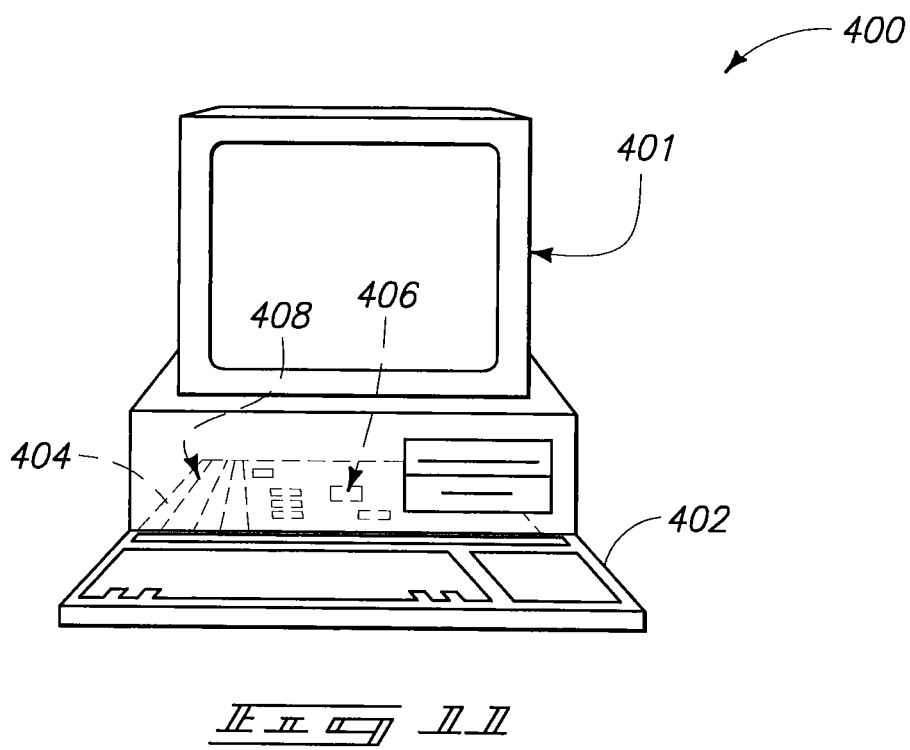
FIG. 11 is a diagrammatic view of a computer embodiment.
Figure 12:
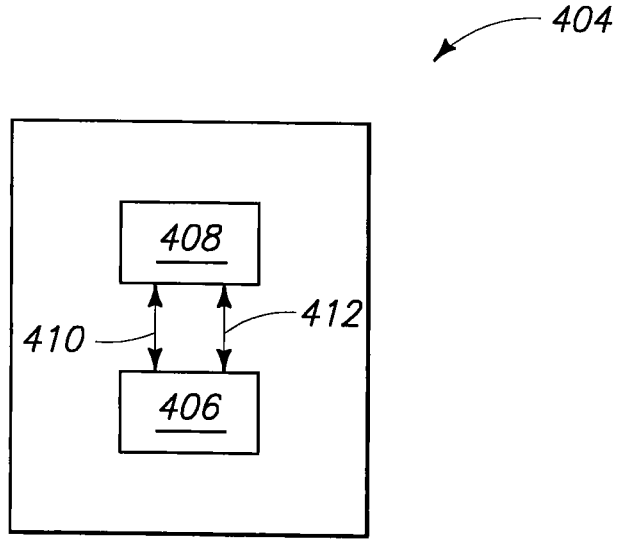
FIG. 12 is a block diagram showing particular features of the motherboard of the FIG. 11 computer embodiment.

FIG. 11 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

Processor device 406 may correspond to a processor module, and associated memory utilized with the module may comprise one or more of the structures and devices of FIGS. 1-10.

Memory device 408 may correspond to a memory module, and may comprise one or more of the structures and devices of FIGS. 1-10.

FIG. 13 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include one or more of the structures and devices of FIGS. 1-10.

FIG. 14 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, an interconnection line 884 for providing a first wordline with pulses, an interconnection line 886 for providing a second wordline with pulses, and an interconnection line 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 and memory device 802 may contain one or more one or more of the structures and devices of FIGS. 1-10.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a structure, comprising:
   forming a first mixed phase dielectric over a first material; the first mixed phase dielectric comprising a first homogeneous mixture of two oxides; one of said two oxides of the first homogeneous mixture having a dielectric constant of greater than or equal to 25, and the other of said two oxides of the first homogeneous mixture having a dielectric constant of less than or equal to 20;
   forming a single phase dielectric over and directly against the first mixed phase dielectric; the single phase dielectric consisting of a composition having a dielectric constant of greater than or equal to 25;
   forming a second mixed phase dielectric over and directly against the single phase dielectric; the second mixed phase dielectric comprising a second homogeneous mixture of two oxides; one of said two oxides of the second homogeneous mixture having a dielectric constant of greater than or equal to 25, and the other of said two oxides of the second homogeneous mixture having a dielectric constant of less than or equal to 20; the first and second mixed phase dielectrics being more amorphous than the single phase dielectric, and being different in composition from one another; and
   forming a second material over the second mixed phase dielectric.

2. The method of claim 1 wherein the composition of the single phase dielectric is selected from the group consisting of ZrO, HfO, TaO, TiO and SrTiO; where the chemical formulas indicate the elements contained in the composition and do not imply any particular stoichiometry of such elements.

3. The method of claim 1 wherein the first and second mixed phase dielectrics consist of mixtures selected from the group consisting of ZrAlO, HfAlO, ZrSiO, HfSiO, ZrHfO, ZrTaO, HfTaO, ZrTiO, HfTiO, TaTiO, HfTaTiO and ZrTaTiO; where the chemical formulas indicate the elements contained in the mixture and do not imply any particular stoichiometry of such elements.

4. The method of claim 1 wherein the first material is over a semiconductor substrate.

5. The method of claim 1 wherein the structure is a capacitor.

6. The method of claim 1 wherein the structure is a transistor gate stack; wherein the first material is charge-retaining material, and wherein the second material is control gate material.

7. The method of claim 1 wherein the first material is electrically conductive.

8. The method of claim 1 wherein the first material comprises a segment of a semiconductor substrate between a pair of source/drain regions, and wherein the first mixed phase dielectric is formed directly over said segment.

9. A method of forming a capacitor, comprising:
   forming a first capacitor electrode over a monocrystalline silicon substrate;
   forming a first mixed phase dielectric over the first capacitor electrode; the mixed phase dielectric comprising a first homogeneous mixture of two oxides; one of said two oxides of the first homogeneous mixture having a dielectric constant of greater than or equal to 25, and the other of said two oxides of the first homogeneous mixture having a dielectric constant of less than or equal to 20;
   forming a single phase dielectric over and directly against the first mixed phase dielectric; the single phase dielectric consisting of a composition having a dielectric constant of greater than or equal to 25;
   forming a second mixed phase dielectric over and directly against the single phase dielectric; the second mixed phase dielectric comprising a second homogeneous mixture of two oxides; one of said two oxides of the second homogeneous mixture having a dielectric constant of greater than or equal to 25, and the other of said two oxides of the second homogeneous mixture having a dielectric constant of less than or equal to 20; the first and second mixed phase dielectrics being more amorphous than the single phase dielectric, and being different in composition from one another; and
   forming a second capacitor electrode over the second mixed phase dielectric.

10. The method of claim 9 wherein the composition of the single phase dielectric is selected from the group consisting of ZrO, HfO, TaO, TiO and SrTiO; where the chemical formulas indicate the elements contained in the composition and do not imply any particular stoichiometry of such elements.

11. The method of claim 9 wherein the first and second mixed phase dielectrics consist of mixtures selected from the group consisting of ZrAlO, HfAlO, ZrSiO, HfSiO, ZrHfO, ZrTaO, HfTaO, ZrTiO, HfTiO, TaTiO, HfTaTiO and ZrTaTiO; where the chemical formulas indicate the elements contained in the mixture and do not imply any particular stoichiometry of such elements.

12. The method of claim 9 wherein the first and second mixed phase dielectrics are formed utilizing atomic layer deposition.

* * * * *